United States Patent
Saitou et al.

(10) Patent No.: US 7,288,587 B2
(45) Date of Patent: Oct. 30, 2007

(54) POLY(PHENYLENE OXIDE) RESIN COMPOSITION, PREPREG, LAMINATES SHEET, PRINTED WIRING BOARD, AND MULTILAYER PRINTED WIRING BOARD

(75) Inventors: Eiitirou Saitou, Kadoma (JP); Kiyotaka Komori, Kadoma (JP); Naoki Itou, Kadoma (JP)

(73) Assignee: Matsushita Electric Works, Ltd., Kadoma-shi (JP)

( * ) Notice: Subject to any disclaimer, the term of this patent is extended or adjusted under 35 U.S.C. 154(b) by 0 days.

(21) Appl. No.: 10/469,692

(22) PCT Filed: Mar. 11, 2002

(86) PCT No.: PCT/JP02/02272

§ 371 (c)(1), (2), (4) Date: Feb. 11, 2004

(87) PCT Pub. No.: WO02/072700

PCT Pub. Date: Sep. 19, 2002

(65) Prior Publication Data

US 2004/0132925 A1    Jul. 8, 2004

(30) Foreign Application Priority Data

Mar. 12, 2001    (JP)    ............ 2001-068857

(51) Int. Cl.
*C08K 5/03* (2006.01)
*B32B 27/00* (2006.01)
*C08F 283/08* (2006.01)

(52) U.S. Cl. ............ 524/464; 524/611; 525/390; 525/391; 428/422.8

(58) Field of Classification Search ............ 524/101, 524/464; 525/390, 391, 53; 428/422.8
See application file for complete search history.

(56) References Cited

U.S. PATENT DOCUMENTS

| 4,102,853 | A | * | 7/1978 | Kawamura et al. | ......... 524/425 |
| 4,786,664 | A | * | 11/1988 | Yates, III | ............. 524/417 |
| 4,874,826 | A | * | 10/1989 | Sakamoto et al. | ......... 525/534 |
| 5,352,745 | A | * | 10/1994 | Katayose et al. | ............ 525/391 |
| 5,880,221 | A | * | 3/1999 | Liska et al. | ................. 525/397 |
| 6,162,876 | A | * | 12/2000 | Yeager et al. | ............... 525/390 |
| 6,518,468 | B1 | * | 2/2003 | Parks et al. | ................. 570/190 |
| 2004/0146692 | A1 | * | 7/2004 | Inoue et al. | ................ 428/141 |

FOREIGN PATENT DOCUMENTS

| EP | 0 382 312 | | 8/1990 |
| EP | 0 494 722 | | 7/1992 |
| JP | 07247416 | A * | 9/1995 |
| JP | 08231847 | A * | 9/1996 |
| JP | 11-012456 | | 1/1999 |
| JP | 2000104038 | A * | 4/2000 |

OTHER PUBLICATIONS

Machine-Assisted Translation of JP 11-012456, Jan. 19, 1999.*
White, D.M., "The Synthesis of 4-Hydroxyarylene Ethers by the Equilibration of Phenols with Poly(2,6-dimethyl-1,4-phenylene ether)," J. Org. Chem. 34, 297 (1969).*

* cited by examiner

*Primary Examiner*—Vasu Jagannathan
*Assistant Examiner*—Vickey Ronesi
(74) *Attorney, Agent, or Firm*—Oblon, Spivak, McClelland, Maier & Neustadt, P.C.

(57) ABSTRACT

The poly(phenylene oxide) resin composition of the invention is a poly(phenylene oxide) resin composition containing poly(phenylene oxide) and triallyl isocyanurate, wherein the poly(phenylene oxide) has a number average molecular weight in a range from 2,000 to 12,000 and the IPN structure can be formed in a cured product of the poly(phenylene oxide) and triallyl isocyanurate to provide a high heat resistance, and at the same time by using a poly(phenylene oxide) with a relatively low molecular weight, the fluidity of the melt resin can be made desirable at the time of molding to result in high molding properties.

23 Claims, No Drawings

POLY(PHENYLENE OXIDE) RESIN COMPOSITION, PREPREG, LAMINATES SHEET, PRINTED WIRING BOARD, AND MULTILAYER PRINTED WIRING BOARD

FIELD OF THE INVENTION

The present invention relates to a poly(phenylene oxide) resin composition useful for an insulating material for printed wiring boards and the like and having heat resistance, prepreg using the poly(phenylene oxide) resin composition, a laminated sheet using the prepreg, and further a printed wiring board and a multilayer printed wiring board using the laminated sheet.

BACKGROUND OF THE INVENTION

Along with high integration of semiconductor devices to be incorporated in, precise fineness of packages, high-density wiring of a printed wiring board, and improvement of the joining and mounting technology, the recent electronic appliances is advanced remarkably and especially development of the electronic appliances such as the mobile communication utilizing high frequency is outstanding.

A printed wiring board composing such kinds of electronic appliances tends to be multilayered and simultaneously to have ultra fine wiring, and therefore, it is efficient to lower the dielectric constant of a material to meet the speed up of the signal transmission speed required for the high speed of the information processing and also it is effective to use a material with a low dielectric dissipation factor (dielectric loss) in order to lower the loss of transmission.

Relying on the excellency in the high frequency properties of such as the dielectric constant, the dielectric loss and the like, poly(phenylene oxide) resin [also referred to as polyphenylene ether (PPE)] is suitable for the printed wiring boards of such electronic appliances using the high frequency bands, however, generally it cannot be said that the poly(phenylene oxide) resin has been sufficient in the heat resistance and dimensional stability.

The applicant of the present invention discloses a poly(phenylene oxide) resin composition provided with improved heat resistance and dimensional stability, a production method of prepreg using the poly(phenylene oxide) resin composition, and a production method of a laminated sheet using the prepreg in Japanese Unexamined Patent Publication No. 7-90172 and also discloses a poly(phenylene oxide) resin composition having a high glass transition temperature, water resistance, moisture resistance, and moisture-absorbing heat resistance in addition to the improvement of the heat resistance and dimensional stability, a production method of prepreg using the poly(phenylene oxide) resin composition, and a production method of a laminated sheet using the prepreg in Japanese Unexamined Patent Publication No. 8-231847.

However, poly(phenylene oxide) itself has a high melting point, the prepreg produced using the poly(phenylene oxide) resin composition has a high melt viscosity and subsequently, for example, when prepreg are layered on a printed wiring board in which conductive patterns are formed as a circuit on the surface and molded by hot pressing in order to produce a multilayer printed wiring board, the viscosity is high and the fluidity is low at the time of melting at a normal molding temperature to make it difficult to sufficiently fill the spaces between neighboring conductive patterns with the resin and easy to leave voids and blurs, and thus there are problems in molding properties.

The invention has been achieved by taking the above described points into consideration and the object is to provide a poly(phenylene oxide) resin composition excellent in the fluidity in the melted state at the time of molding and in molding properties and also to provide prepreg using the poly(phenylene oxide) resin composition, a laminated sheet, a printed wiring board, and a multilayer printed wiring board.

SUMMARY OF THE INVENTION

A poly(phenylene oxide) resin composition according to claim 1 of the invention is a poly(phenylene oxide) resin composition containing poly(phenylene oxide) and triallyl isocyanurate, wherein the number average molecular weight of the poly(phenylene oxide) is in a range from 2,000 to 12,000.

By using a poly(phenylene oxide) resin composition with the above-described constitution, an IPN structure can be produced from a cured material of the poly(phenylene oxide) and triallyl isocyanurate to obtain a high heat resistance and also by using a poly(phenylene oxide) with a relatively low molecular weight, the fluidity of the melt resin at the time of molding can be made desirable to increase the molding properties.

The embodiments of the invention will be described hereinafter.

The poly(phenylene oxide) (hereinafter referred to as PPO) to be employed in the invention is also called as polyphenylene ether (PPE) and a resin whose chemical structural formula can be defined as the following general formula (1)

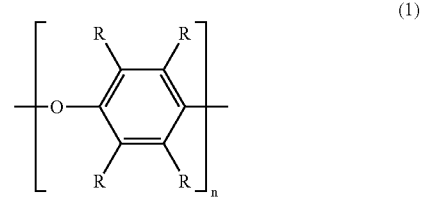

(1)

(wherein the reference character n denotes the number of repeating time and an integer of 200 to 400; and the reference character R denotes H or a hydrocarbon group of 1 to 3 carbons and may be same or different to one another)

One example of PPO having the above described general formula (1) is poly(2,6-dimethyl-1,4-phenylene oxide) having the following general formula (2).

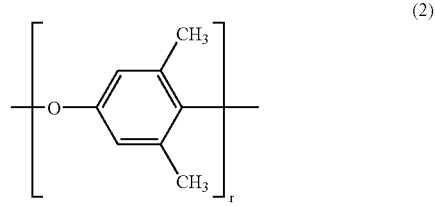

(2)

(wherein the reference character r denotes the number of repeating time and an integer of 200 to 400)

Those synthesized by, for example, a method disclosed in U.S. Pat. No. 4,059,568 can be used as such PPO without any particular restrictions, yet those having a weight average molecular weight (Mw) of 46,000 to 53,000 and the ratio to the number average molecular weight (Mn), that is, molecular weight distribution (Mw/Mn), of 4.0 to 4.5 are preferable to be used. However, since the melting point and the melt viscosity of PPO are high as it is, the melt viscosity of a resin composition containing PPO is high and in the case of using the resin composition as a material for prepreg for producing a multilayer printed wiring board, there occurs a problem in the molding properties. For that, the invention tries to decrease the melt viscosity and improve the molding properties of the resin composition by decreasing the molecular weight of PPO.

As a technique to decrease the molecular weight of PPO, a method described in "The Journal of Organic Chemistry, 34, 297-303 (1969)" involving a reaction of PPO with a phenolic compound can be employed. The phenolic compound to be used for the reaction is not particularly restricted if it has a structure of an aromatic ring in which an HO group is bonded to a carbon atom and it includes, for example, phenol, cresol, xylenol, hydroquinone, pyrogallol, bisphenol A, 2,6-dimethylphenol, 4,4'-dihydroxydiphenyl ether and the like and in order to improve the heat resistance after curing, it is more preferable to use a multifunctional phenolic compound having two or more phenolic hydroxy groups in a molecule. Further, as an initiator of the reaction, it is preferable to use the following oxidizing agent, benzoyl peroxide, 3,3',5,5'-tetramethyl-1,4-diphenoquinone, chloranil, 2,4,6-tri-tert-butylphenoxyl, tert-butylperoxyisopropyl monocarbonate, azobisisobutyronitrile and the like and based on the necessity, the reaction can be accelerated by a carboxylic acid metal salt. Further, it is more preferable to use an initiator which is capable of generating a highly volatile component just like a lower molecular weight alcohol as a component after reaction since it can suppress the increase of the dielectric constant. The PPO reacted with a phenolic compound in such a manner to decrease the molecular weight is required to have the number average molecular weight in a range from 2,000 to 12,000, preferably from 3,000 to 12,000. If the number average molecular weight is higher than 12,000, the melt viscosity is too high to improve the molding properties and if the number average molecular weight is lower than 2,000, the molecular weight is so low that it is difficult to obtain a high heat resistance. Further in the case the number average molecular weight is lower than 3,000, the glass transition temperature tends to be slightly lowered.

Further, in the invention, in order to improve the heat resistance and the dimensional stability, the PPO resin composition of the invention is produced by mixing triallyl isocyanurate (hereinafter referred to as TAIC) with PPO made to have a lowered molecular weight. Further, as the TAIC, either its monomer (hereinafter referred to as m-TAIC) or prepolymer (hereinafter referred to as p-TAIC) may be used or both may be used in combination.

The PPO resin composition of the invention may contain a compatibilizer based on the necessity. In that case, it is preferable to produce the PPO resin. composition of the invention by adding, as the compatibilizer, at least one of the polymer selected from styrene-butadiene block copolymer, styrene-isoprene block copolymer, 1,2-polybutadiene, 1,4-polybutadiene, maleic acid-modified polybutadiene, acrylic acid-modified polybutadiene, epoxy-modified polybutadiene.

Further, the PPO resin composition of the invention may contain a flame retardant based on the necessity. In the case a solvent is added to the PPO resin composition containing the PPO made to have a low molecular weight and TAIC to use the resulting composition as varnish, it is preferable to use, as the flame retardant, a nonreactive organic brominated compound with the PPO and TAIC. Because if a laminated sheet is produced by curing the composition in the state the thermoplastic PPO and the thermosetting TAIC are mixed, both form Interpenetrating Polymer Net Work (IPN) and provide a structure extremely excellent for the laminated sheet with a high heat resistance. In that case, if an reactive organic brominated compound on PPO or TAIC, which means having an unsaturated bond, is used, the compound penetrates the IPN of PPO-TAIC to inhibit IPN formation and as a result, un-polymerized residue of TAIC remains much and it is probable to result in decrease of the water resistance, moisture resistance, moisture-absorbing heat resistance, and glass transition temperature (hereinafter referred to as Tg) of the laminated sheet produced using the obtained PPO resin composition.

Further, the flame retardant is preferable to be used while being dispersed but not dissolved in a solvent. As the flame retardant is an nonreactive organic brominated compound on PPO and TAIC and dispersed but not dissolved in a solvent, the flame retardant can exist as a filler in the resin and does not inhibit IPN formation of PPO-TAIC to result in excellent IPN formation owing to almost complete curing of TAIC and in improvement of the water resistance, moisture resistance, moisture-absorbing heat resistance, and Tg.

Further, the foregoing organic brominated compound is preferable to have a true specific gravity of 2.0 to 3.5. That is, if the true specific gravity of the organic brominated compound is lower than 2.0, the dispersibility in varnish is inferior, whereas if the true specific gravity of the organic brominated compound is higher than 3.5, the compound is easy to be precipitated in varnish of the PPO resin composition of the invention and no even varnish can be obtained unless being stirred constantly and thus the workability becomes inferior.

As the organic brominated compound as described above, aromatic organic brominated compounds are preferable and examples are decabromodiphenylethane having the following chemical structural formula (3), 4,4-dibromobiphenyl having the following chemical structural formula (4) and the like.

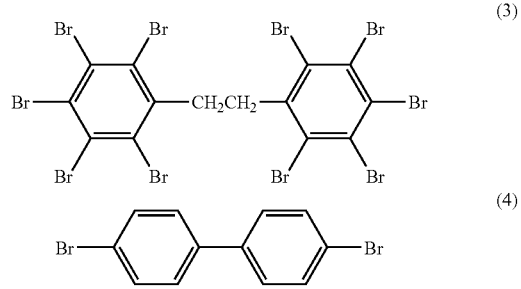

In the PPO resin composition of the invention, the PPO made to have a low molecular weight is preferable to be added in a ratio of 30 to 60 parts by weight in the entire resin composition. If the ratio of PPO made to have a low molecular weight is less than 30 parts by weight, the laminated sheet produced from the PPO resin composition is easy to become brittle and if the PPO made to have a low molecular weight is more than 60 parts by weight, sufficient IPN cannot be formed and the water resistance, moisture resistance, moisture-absorbing heat resistance, and Tg cannot be improved sufficiently.

In the PPO resin composition of the invention, the TAIC is preferable to be added in a ratio of 35 to 62 parts by weight in the entire resin composition. If the ratio of the TAIC is less than 35 parts by weight, sufficient IPN cannot be formed and the water resistance, moisture resistance, moisture-absorbing heat resistance, and Tg cannot be improved sufficiently. On the other hand, if the TAIC is more than 62 parts by weight, the laminated sheet produced from the PPO resin composition is easy to become brittle.

Further, in the case an organic brominated compound is used as a flame retardant, it is preferable to set the content of the organic brominated compound as to keep the bromine content 8 to 20% by weight in the entire amount of the PPO resin composition of the invention. Incidentally, the term, the entire amount of the resin composition, means the entire amount of the resin composition in the state the resin composition contains no solvent. If the bromine content is less than 8% by weight in the entire PPO resin composition, the laminated sheet produced from the PPO resin composition is inferior in the flame retarding property and cannot maintain the flame retarding property at 94V-0 level defined as UL standard. On the contrary, if it is more than 20% by weight, bromine (Br) is easy to be isolated at the time of molding by heating and pressurizing to produce the laminated sheet to deposit on the surface of the laminated sheet and the heat resistance of the laminated sheet probably tends to decrease.

Further, in the PPO resin composition of the invention, the content of the compatibilizer is preferable to be 10% by weight or lower in the entire amount of the poly(phenylene oxide) resin composition. If the content of the compatibilizer is more than that, the heat resistance is possible to decrease and it is therefore not preferable.

Furthermore, the PPO resin composition of the invention may contain an inorganic filler based on the necessity. The inorganic filler to be added is not specifically restricted if it has the average particle diameter of 30 μm or smaller. By adding such an inorganic filler to the PPO resin composition of the invention, the water absorption ratio can be lowered, the strength can be increased at the time of high temperature heating, for example, in the case of soldering treatment or the like, and the ratio of dimensional change following the heating can be decreased. Moreover, such fine inorganic filler is capable of improving the transparency of the molded product and therefore, if those with an average particle diameter of 5 μm or smaller are used, a further excellent effect can be expected. On the contrary, if the average particle diameter is larger than 30 μm, the transparency of the molded product decreases, the electric insulation property is deteriorated, or further the soldering heat resistance decreases after moisture absorption owing to the unevenness of the stress decreasing effect. Incidentally, the lower limit of the average particle diameter is 0.05 μm and if smaller than 0.05 μm, the PPO resin composition of the invention probably becomes thicker.

As practical examples of the inorganic filler, silica is preferable and it can contribute to the flame retarding property as well in addition to the effect as described above.

The addition amount of the inorganic filler is preferable to be not less than 3 parts by weight and less than 50 parts by weight to 100 parts by weight of resin solid matter. By setting in such a range, the water absorption ratio can be lowered, the strength can be increased at the time of high temperature heating, for example, in the case of soldering treatment or the like, and the ratio of dimensional alteration following the heating can be decreased. Incidentally, addition of 5 parts by weight or more is more preferable. On the other hand, if the addition amount is less than 3 parts by weight, it is probable that dimensional stability following the heating increases and if more than 50 parts by weight, it is probable that the filler becomes difficult to be dispersed evenly or the adhesive force is deteriorated.

Prepreg can be produced using the PPO resin composition of the invention as described above and in order to obtain prepreg by impregnating a substrate with the PPO resin composition of the invention, a PPO resin varnish is prepared by adding PPO made to have a lower molecular weight, TAIC, a compatibilizer to be added based on the necessity, an organic brominated compound as a flame retardant to be added based on the necessity, and an organic solvent. The organic solvent is not particularly restricted if it is capable of dissolving the resin components and does not cause bad effects on the reaction and those which are incapable of dissolving the organic brominated compound are preferable. As such an organic brominated compound, the following compounds may be used solely or as a mixture of two or more of them: ketones such as methyl ethyl ketone, ethers such as dibutylether, esters such as ethyl acetate, amides such as dimethylformamide, aromatic hydrocarbons such as benzene, toluene, and xylene, and chlorohydrocarbons such as trichloroethylene. The concentration of the resin solid matter of the varnish may properly be adjusted corresponding to the work of impregnation of a substrate with the varnish and, for example, it is properly 50 to 90% by weight.

The varnish prepared as described above is used to impregnate a substrate with and the organic solvent is evaporated by heating and drying to obtain prepreg. As the substrate, a fabric or non-woven fabric made of organic fibers or glass fibers can be used. Since the prepreg comprises the above described PPO resin composition, the cured material is excellent in the electric properties of such as dielectric constant, the heat resistance, the dimensional stability, the water resistance, the moisture resistance, and the moisture-absorbing heat resistance and has a high glass transition temperature. The impregnation amount of the substrate with the varnish is preferable to be 35% by weight or higher on the bases of the weight ratio to the resin solid matter in the prepreg. Since the dielectric constant of the substrate is generally higher than that of the resin, in order to lower the dielectric constant of the laminated sheet to be obtained using the prepreg, it is preferable to keep the content of the resin solid matter in the prepreg be higher % by weight than that described above. For example, in the case of the prepreg using an E glass fabric as the substrate, the dielectric constant can be suppressed to be 3.7 or lower with the content of resin solid matter of 37% by weight or higher and in the case of the prepreg using an NE glass fabric as the substrate, the dielectric constant can be suppressed to be 3.4 or lower with the content of resin solid matter of 45% by weight or higher.

In the invention, the laminated sheet can be produced using the prepreg obtained as described above. That is, a sheet or a plurality of sheets of the foregoing prepreg are layered and a metal foil such as a copper foil is laminated on both or one face in the upper and lower sides and the resulting body is united in multilayers by hot pressing molding to obtain the laminated sheet bearing the copper foil in both faces or in one face. Since the laminated sheet obtained in such a manner is produced using the foregoing prepreg, the laminated sheet is excellent in the electric properties of such as dielectric constant, the heat resistance, the dimensional stability, the water resistance, the moisture resistance, and the moisture-absorbing heat resistance and has a high glass transition temperature.

A printed wiring board having conductive patterns as a circuit on the surface of the laminated sheet can be obtained by forming the circuit by etching process of the metal foil on the surface of the laminated sheet produced as described above. Since the printed wiring board obtained in such a manner is produced using the above-described laminated sheet, the printed wiring board is excellent in the electric properties of such as dielectric constant, the heat resistance, the dimensional stability, the water resistance, the moisture resistance, and the moisture-absorbing heat resistance.

Further, using the printed wiring board as a printed wiring board for an inner layer and after the surface treatment is carried out in the metal foil of the conductive patterns, a plurality of printed wiring boards are layered through the prepreg obtained in the invention and then a metal foil is laminated on the outermost layer of the resulting body through the prepreg obtained in the invention and the obtained body is united in multilayers by heating and pressurizing molding to obtain a multilayer printed wiring board. In the case of the molding of such a multilayer printed wiring board, since PPO of the PPO resin composition of the invention has a molecular weight as low as 2,000 to 12,000, melt viscosity is low, and fluidity is excellent, molding can be carried out without formation of voids and occurrence of blurs and the spaces between neighboring conductive patterns are sufficiently filled with a resin and a multilayer printed wiring board having a highly reliable circuit and excellent in electric properties can be obtained.

Incidentally, the molding conditions of the above-described respective prepreg, laminated sheet, printed wiring board, and multilayer printed wiring board are different depending on the mixing ratio of the respective raw materials of the PPO resin composition and not particularly restricted, and generally, it is preferable to carry out heating and pressurizing for a proper duration in the conditions that the temperature is 170° C. or higher and 230° C. or lower and the pressure is 0.98 MPa or higher and 5.9 MPa or lower (10 kg/cm² or higher and 60 kg/cm² or lower).

EXAMPLES

The invention will be described more particularly with the reference to examples.

Example 1

PPO (trade name: Noryl PX9701, produced by GE Plastics Japan Ltd., the number average molecular weight 14,000) in 30 parts by weight, bisphenol A as a phenolic compound in 0.30 parts by weight, tert-butylperoxyisopropyl monocarbonate (trade name: Perbutyl I, produced by Nippon Oil & Fats Corporation) in 0.27 parts by weight, and cobalt naphthenate in 0.008 parts by weight were mixed together and further toluene as a solvent in 90 parts by weight was added and mixed at 80° C. for 1 hour to carry out dispersion and dissolution to bring reaction, and adjust the molecular weight of PPO. Transparent PPO, whose molecular weight was lowered, in the PPO solution obtained after the treatment was found having a number average molecular weight of 7,800 by gel permeation chromatography (GPC).

To the PPO solution with a number average molecular weight of 7,800 obtained in such a manner, m-TAIC (Nippon Kasei Chemical Co., Ltd.) in 30 parts by weight, p-TAIC (trade name: P-TAIC-1000C, Dai-Ichi Kogyo Seiyaku Co., Ltd.) in 20 parts by weight (since it contains a solvent, the content of TAIC was 16 parts by weight), a styrene-butadiene block copolymer (trade name: Tufprene A, produced by Asahi Kasei Corporation) as a compatibilizer in 5 parts by weight, decabromodiphenylethane, which is an organic brominated compound, (trade name: Planelon BDE, produced by Mitsui Toatsu Fine Chemicals, Inc., Br 82.3% by weight) as a flame retardant in 15 parts by weight, and α, α'-bis(tert-butylperoxy-m-isopropyl)benzene (trade name: PB-P, produced by Nippon Oil & Fats Corporation) as an initiation in 3 parts by weight were added and the resulting mixture was mixed with toluene, a solvent, to carry out dispersion and dissolution and obtain a varnish of the PPO resin composition.

In the varnish of the PPO resin composition made to have a lowered molecular weight and obtained in such a manner, since the flame retardant was the organic brominated compound which was non-reactive on PPO and TAIC, the flame retardant was not dissolved but dispersed in the solvent in the varnish.

Examples 2 to 16

The molecular weight adjustment of PPO, the types and the amounts of the phenolic compound and the initiator were set as shown in Table 1 to Table 6 and the PPO solutions with the adjusted molecular weight were mixed with TAIC, compatibilizers, flame retardants, the initiator (the same initiator as that of example 1) while the types and the amounts of these additives being adjusted as shown in Table 1 to Table 6 and the resulting mixtures were mixed with toluene, a solvent, to carry out dispersion and dissolution and obtain varnish of PPO resin compositions with lowered molecular weights. Incidentally, in Table 2, AIBN stands for azobisisobutyronitrile and in Table 3, "Saytex 8010" is a decabromo-aromatic compound produced by Albemarle Corporation. Also, in Table 5, "SR-245" is an addition type flame retardant (trade name: SR-245, produced by Nissan Chemical Industries, Ltd., Br 67.4% by weight), which is a dissolution type flame retardant dissolved in a solvent (toluene) having a chemical formula (5) and pentabromodiphenyl ether is an addition type flame retardant (produced by Mitsui Toatsu Fine Chemicals, Inc., Br 70% by weight) with a specific gravity of 2.2.

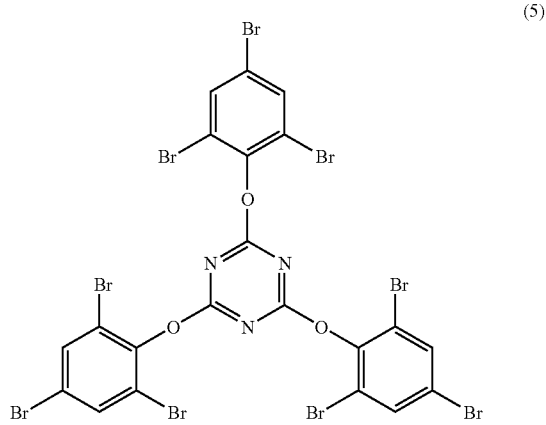

(5)

Example 17

Varnish of a PPO resin composition was obtained in the same manner as the example 1 except that 15 amount of Silica (FB6D: Denki Kagaku Kogyo Co. Ltd., average diameter 6.9 μm) was added.

Comparative Example 1

Varnish of a PPO resin composition was obtained in the same manner as the example 1 except that the molecular weight of PPO was not adjusted and PPO was used as it was.

Next, E glass cloths (trade name: 116E, produced by Nitto Boseki Co., Ltd.) were separately impregnated with the varnish of the PPO resin composition obtained in each of the examples 1 to 17 and the comparative example 1 in the above described manner and then heated and dried at 120° C. for 5 minutes to remove the solvent and obtain prepreg with the resin content of 50% by weight.

Each of the obtained prepreg was subjected to evaluation of resin fluidity. The test of the resin fluidity was carried out in accordance with JIS C 6521. The results are shown in Table 1 to Table 6.

A 35 μm-thick copper foil (a ST foil) was laminated on both faces of one sheet of the prepreg obtained in such a manner and the resulting prepreg was heated and pressurized in molding conditions of a temperature of 180° C. and a pressure of 2.9 MPa (30 kg/cm²) for 180 minutes to obtain a double-sided copper clad laminate for a multilayer printed wiring board.

Next, using the double-sided copper clad laminate, conductive patterns as circuits for inner layers were produced by carrying out printed wiring process for the copper foil in both faces to obtain a printed wiring board for an inner layer. After that, the surface of the conductive patterns of the copper foil in both faces of the printed wiring board for the inner layer was blackened and 2 sheets of such printed wiring boards for inner layers were layered while one sheet of prepreg being laminated on both faces of each printed wiring board and further a 18 μm-thick copper foil (an ST foil) was laminated on both upper and lower side faces and the resulting laminated body was heated and pressurized in molding conditions of a temperature of 180° C. and a pressure of 2.9 MPa (30 kg/cm²) for 180 minutes to obtain a 6-layer copper clad laminate for a multilayer printed wiring board.

The 6-layer copper clad laminate for a multilayer printed wiring board obtained in such a manner was cut into 50 mm×50 mm and the copper foil in the outer layer was removed by etching and its molding property, moisture absorption rate, and soldering heat resistance after moisture absorption were evaluated. In this case, the molding property was judged by eye observation of the existence of voids and blurs using a lattice pattern as an inner pattern with a conductor thickness of 35 μm, the remaining copper ratio of 50%, and pitches of 2.54 mm. The measurement of the moisture absorption rate was carried out based on JIS C 6481. The measurement of moisture-absorbing heat resistance was carried by eye observation of the occurrence of blisters in the case five specimens of each copper-laminated laminated sheet were subjected to a boiling D-2/100 test for boiling at 100° C. for 2 hours and a pressure cooker test (PCI) at 135° C. and 2 atmospheric pressure for 2 hours and then immersed in a solder bath at 260° C. for 20 seconds. These results are shown in Table 1 to Table 6.

Also, each 6-layer copper-laminated laminated sheet for the multilayer printed wiring board was cut into 100 mm×10 mm and in accordance with JIS C 6481, the adhesion strength between the copper foil and the resin in the side where the inner layer treatment was carried out was measured to evaluate the adhesion strength of the copper foil in the inner layer. The results are shown in Table 1 to Table 6.

Further, 5 sheets of prepreg were layered and a 18 μm-thick copper foil (an ST foil) were laminated on the both upper and lower faces and the resulting layered body was heated and pressurized in molding conditions of a temperature of 180° C. and a pressure of 4.9 MPa (50 kg/cm²) for 180 minutes to obtain a copper-double-sided laminated sheet for a multilayer printed wiring board.

The copper foil on the surface of the obtained copper-double-sided laminated sheet was removed by etching and then the laminated sheet was cut into 50 mm×50 mm and its glass transition temperature (Tg), dielectric constant, dissipation factor, flame retardancy, and adhesion strength to the copper foil were evaluated. In this case, the glass transition temperature was measured by a viscoelasticity spectrometer and the flame retarding property was evaluated by UL method. The dielectric constant, the dissipation factor, and the adhesion strength to the copper foil were measured in accordance with JIS C 6481. These results are shown in Table 1 to Table 6.

TABLE 1

|  |  | example 1 | example 2 | example 3 |
|---|---|---|---|---|
| | | | (parts by weight, % by weight) | |
| PPO resin varnish | PPO addition amount | 30 | 30 | 30 |
| | phenol type | bisphenol A | bisphenol A | bisphenol A |
| | phenolic compound addition amount | 0.3 | 0.3 | 0.3 |
| | initiator | Perbutyl I | Perbutyl I | benzoyl peroxide |
| | initiator addition amount | 0.27 | 0.2 | 0.2 |
| | molecular weight of PPO | 7800 | 11000 | 2800 |
| | TAIC addition amount | 46 | 46 | 46 |
| | compatibilizer | styrene-butadiene copolymer | styrene-butadiene copolymer | styrene-butadiene copolymer |
| | compatibilizer addition amount | 5 | 5 | 5 |
| | flame retardant | decabromo-diphenylethane | decabromo-diphenylethane | decabromo-diphenylethane |
| | flame retardant true specific gravity | 3.2 | 3.2 | 3.2 |
| | flame retardant addition amount | 15 | 15 | 15 |
| | bromine content (%) | 13 | 13 | 13 |
| | dispersion state of flame retardant | good | good | good |
| prepreg | resin fluidity (%) | 20.4 | 15.8 | 27.2 |
| laminated sheet | Tg (° C.) | 201 | 208 | 191 |
| | dielectric constant (1 MHz) | 3.53 | 3.5 | 3.61 |
| | dissipation factor (1 MHz) | 0.0027 | 0.0026 | 0.0032 |

TABLE 1-continued

|  |  | example 1 | example 2 | example 3 |
|---|---|---|---|---|
|  |  | (parts by weight, % by weight) | | |
|  | flame retardancy | V-0 | V-0 | V-0 |
|  | adhesion strength to copper foil (kgf/cm$^2$) | 1.35 | 1.41 | 1.2 |
| multilayer printed wiring board | secondary molding property | good | good | good |
|  | moisture absorption rate | 0.28 | 0.25 | 0.27 |
|  | soldering heat resistance after moisture absorption | no abnormality | no abnormality | no abnormality |
|  | adhesion strength to copper foil in inner layer (Kgf/cm$^2$) | 0.83 | 0.71 | 0.88 |

TABLE 2

|  |  | example 4 | example 5 | example 6 |
|---|---|---|---|---|
|  |  | (parts by weight, % by weight) | | |
| PPO resin varnish | PPO addition amount | 30 | 30 | 30 |
|  | phenol type | bisphenol A | 2,6-dimethylphenol | bisphenol A |
|  | phenolic compound addition amount | 0.3 | 0.3 | 0.3 |
|  | initiator | AIBN | Perbutyl I | Perbutyl I |
|  | initiator addition amount | 0.27 | 0.27 | 0.35 |
|  | molecular weight of PPO | 9100 | 7800 | 4000 |
|  | TAIC addition amount | 46 | 46 | 46 |
|  | compatibilizer | styrene-butadiene copolymer | styrene-butadiene copolymer | — |
|  | compatibilizer addition amount | 5 | 5 | — |
|  | flame retardant | decabromo-diphenylethane | decabromo-diphenylethane | decabromo-diphenylethane |
|  | flame retardant true specific gravity | 3.2 | 3.2 | 3.2 |
|  | flame retardant addition amount | 15 | 15 | 15 |
|  | bromine content (%) | 13 | 13 | 13 |
|  | dispersion state of flame retardant | good | good | good |
| prepreg laminated sheet | resin fluidity (%) | 14.5 | 20.4 | 23.1 |
|  | Tg (° C.) | 198 | 201 | 211 |
|  | dielectric constant (1 MHz) | 3.59 | 3.55 | 3.6 |
|  | dissipation factor (1 MHz) | 0.003 | 0.0027 | 0.0031 |
|  | flame retardancy | V-0 | V-0 | V-0 |
|  | adhesion strength to copper foil (kgf/cm$^2$) | 1.33 | 1.29 | 1.44 |
| multilayer printed wiring board | secondary molding property | good | good | good |
|  | moisture absorption rate | 0.25 | 0.31 | 0.33 |
|  | soldering heat resistance after moisture absorption | no abnormality | no abnormality | no abnormality |
|  | adhesion strength to copper foil in inner layer (Kgf/cm$^2$) | 0.8 | 0.81 | 0.76 |

TABLE 3

|  |  | example 7 | example 8 | example 9 |
|---|---|---|---|---|
|  |  | (parts by weight, % by weight) | | |
| PPO resin varnish | PPO addition amount | 30 | 30 | 45 |
|  | phenol type | bisphenol A | bisphenol A | bisphenol A |
|  | phenolic compound addition amount | 0.3 | 0.3 | 0.45 |
|  | initiator | Perbutyl I | Perbutyl I | Perbutyl I |
|  | initiator addition amount | 0.27 | 0.27 | 0.53 |
|  | molecular weight of PPO | 7800 | 7800 | 4000 |
|  | TAIC addition amount | 46 | 46 | 31 |
|  | compatibilizer | styrene-butadiene copolymer | styrene-butadiene copolymer | — |
|  | compatibilizer addition amount | 5 | 5 | — |
|  | flame retardant | — | Saytex8010 | decabromo-diphenylethane |

TABLE 3-continued

|  |  | example 7 | example 8 | example 9 |
|---|---|---|---|---|
|  | flame retardant true specific gravity | — | 3.2 | 3.2 |
|  | flame retardant addition amount | — | 15 | 15 |
|  | bromine content (%) | — | 13 | 13 |
|  | dispersion state of flame retardant | — | good | good |
| prepreg laminated sheet | resin fluidity (%) | 20.4 | 19.2 | 13.9 |
|  | Tg (° C.) | 207 | 205 | 197 |
|  | dielectric constant (1 MHz) | 3.48 | 3.55 | 3.46 |
|  | dissipation factor (1 MHz) | 0.0025 | 0.0027 | 0.0025 |
|  | flame retardancy | HB | V-0 | V-0 |
|  | adhesion strength to copper foil (kgf/cm$^2$) | 1.4 | 1.31 | 1.2 |
| multilayer printed wiring board | secondary molding property | good | good | good |
|  | moisture absorptivity | 0.3 | 0.23 | 0.22 |
|  | soldering heat resistance after moisture absorption | no abnormality | no abnormality | no abnormality |
|  | adhesion strength to copper foil in inner layer (Kgf/cm$^2$) | 0.92 | 0.78 | 0.8 |

TABLE 4

|  |  | example 10 | example 11 | example 12 |
|---|---|---|---|---|
| PPO resin varnish | PPO addition amount | 25 | 30 | 30 |
|  | phenol type | bisphenol A | bisphenol A | bisphenol A |
|  | phenolic compound addition amount | 0.25 | 0.3 | 0.3 |
|  | initiator | Perbutyl I | Perbutyl I | Perbutyl I |
|  | initiator addition amount | 0.23 | 0.27 | 0.55 |
|  | molecular weight of PPO | 4000 | 7800 | 2400 |
|  | TAIC addition amount | 51 | 46 | 46 |
|  | compatibilizer | — | styrene-butadiene copolymer | styrene-butadiene copolymer |
|  | compatibilizer addition amount | — | 5 | 5 |
|  | flame retardant | decabromo-diphenylethane | decabromo-diphenylethane | decabromo-diphenylethane |
|  | flame retardant true specific gravity | 3.2 | 3.2 | 3.2 |
|  | flame retardant addition amount | 15 | 10 | 15 |
|  | bromine content (%) | 13 | 9 | 13 |
|  | dispersion state of flame retardant | good | good | good |
| prepreg laminated sheet | resin fluidity (%) | 26.4 | 20.4 | 33.2 |
|  | Tg (° C.) | 213 | 202 | 140 |
|  | dielectric constant (1 MHz) | 3.62 | 3.5 | 3.67 |
|  | dissipation factor (1 MHz) | 0.0029 | 0.0026 | 0.0032 |
|  | flame retardancy | V-0 | V-0 | V-0 |
|  | adhesion strength to copper foil (kgf/cm$^2$) | 1.18 | 1.35 | 1.25 |
| multilayer printed wiring board | secondary molding property | good | good | good |
|  | moisture absorptivity | 0.34 | 0.31 | 0.22 |
|  | soldering heat resistance after moisture absorption | no abnormality | no abnormality | no abnormality |
|  | adhesion strength to copper foil in inner layer (Kgf/cm$^2$) | 0.75 | 0.87 | 0.61 |

TABLE 5

|  |  | example 13 | example 14 | example 15 |
|---|---|---|---|---|
| PPO resin varnish | PPO addition amount | 30 | 30 | 52 |
|  | phenol type | bisphenol A | bisphenol A | bisphenol A |
|  | phenolic compound | 0.3 | 0.3 | 0.52 |

TABLE 5-continued

|  |  | example 13 | example 14 | example 15 |
|---|---|---|---|---|
|  |  | | (parts by weight, % by weight) | |
|  | addition amount | | | |
|  | initiator | Perbutyl I | Perbutyl I | Perbutyl I |
|  | initiator addition amount | 0.27 | 0.27 | 0.53 |
|  | molecular weight of PPO | 7800 | 7800 | 7800 |
|  | TAIC addition amount | 46 | 46 | 24 |
|  | compatibilizer | styrene-butadiene copolymer | styrene-butadiene copolymer | styrene-butadiene copolymer |
|  | compatibilizer addition amount | 5 | 5 | 5 |
|  | flame retardant | SR-245 | pentabromo-diphenyl ether | decabromo-diphenylethane |
|  | flame retardant true specific gravity | 2.3 | 2.2 | 3.2 |
|  | flame retardant addition amount | 20 | 19 | 15 |
|  | bromine content (%) | 16 | 16 | 13 |
|  | dispersion state of flame retardant | dissolved | partially dissolved | good |
| prepreg laminated sheet | resin fluidity (%) | 23.3 | 21.4 | 13.9 |
|  | Tg (° C.) | 147 | 163 | 168 |
|  | dielectric constant (1 MHz) | 3.6 | 3.55 | 3.44 |
|  | dissipation factor (1 MHz) | 0.0029 | 0.0028 | 0.0025 |
|  | flame retardancy | V-0 | V-0 | V-0 |
|  | adhesion strength to copper foil (kgf/cm$^2$) | 1.01 | 1.03 | 0.88 |
| multilayer printed wiring board | secondary molding property | good | good | sligtly blurring |
|  | moisture absorption rate | 0.71 | 0.34 | 0.22 |
|  | soldering heat resistance after moisture absorption | occurrence of measling | no abnormality | no abnormality |
|  | adhesion strength to copper foil in inner layer (Kgf/cm$^2$) | 0.8 | 0.75 | 0.31 |

TABLE 6

|  |  | example 16 | example 17 | comparative example 1 |
|---|---|---|---|---|
|  |  | | (parts by weight, % by weight) | |
| PPO resin varnish | PPO addition amount | 20 | 30 | 30 |
|  | phenol type | bisphenol A | bisphenol A | — |
|  | phenolic compound addition amount | 0.25 | 0.3 | — |
|  | initiator | Perbutyl I | Perbutyl I | — |
|  | initiator addition amount | 0.23 | 0.27 | — |
|  | molecular weight of PPO | 7800 | 7800 | 14000 |
|  | TAIC addition amount | 46 | 46 | 46 |
|  | compatibilizer | styrene-butadiene copolymer | styrene-butadiene copolymer | styrene-butadiene copolymer |
|  | compatibilizer addition amount | 5 | 5 | 5 |
|  | flame retardant | decabromo-diphenylethane | decabromo-diphenylethane | decabromo-diphenylethane |
|  | flame retardant true specific gravity | 3.2 | 3.2 | 3.2 |
|  | flame retardant addition amount | 15 | 15 | 15 |
|  | bromine content (%) | 14 | 13 | 13 |
|  | dispersion state of flame retardant | good | good | good |
| prepreg laminated sheet | resin fluidity (%) | 26.4 | 20.4 | 4.4 |
|  | Tg (° C.) | 211 | 206 | 199 |
|  | dielectric constant (1 MHz) | 3.69 | 3.59 | 3.56 |
|  | dissipation factor (1 MHz) | 0.0033 | 0.0024 | 0.0028 |
|  | flame retardancy | V-0 | V-0 | V-0 |
|  | adhesion strength to copper foil (kgf/cm$^2$) | 1.25 | 1.27 | 0.87 |

TABLE 6-continued

| | | (parts by weight, % by weight) | | |
|---|---|---|---|---|
| | | example 16 | example 17 | comparative example 1 |
| multilayer printed wiring board | secondary molding property | good | good | blurs observed |
| | moisture absorption rate | 0.5 | 0.23 | 0.3 |
| | soldering heat resistance after moisture absorption | occurrence of blister | no abnormality | occurrence of blister |
| | adhesion strength to copper foil in inner layer (Kgf/cm$^2$) | 0.24 | 0.77 | 0.45 |

As shown in Table 1 to Table 6, those of the respective examples were found having good fluidity of the resin of prepreg as compared with that of the comparative example 1 and also good molding property of the multilayer printed wiring boards. Incidentally, since the molecular weight of PPO in the example 12 was slightly low, the glass transition temperature was rather low and the example 13 had problems in points of the glass transition temperature, the moisture absorption rate, and heat resistance after moisture absorption since it employed a flame retardant to be dissolved in the solvent of the varnish: the example 14 has a problem in a point of the glass transition temperature, since it employed a flame retardant to be partly dissolved in the solvent of the varnish: the example 15 has a problem in a point of the glass transition since the addition amount of TAIC is a little: and the example 16 has a problem in a point of the heat resistance after moisture absorption since the addition amount of PPO is a little.

As described above, the poly(phenylene oxide) resin composition of the invention is a poly(phenylene oxide) resin composition containing poly(phenylene oxide) and triallyl isocyanurate, wherein the number average molecular weight of the poly(phenylene oxide) is made to be in a range from 2,000 to 12,000 in the presence of a phenolic compound and an initiator, so that the IPN structure of the poly(phenylene oxide) and triallyl isocyanurate can be formed to obtain a high heat resistance and the fluidity of the melt resin at the time of molding can be desirable owing to the use of the poly(phenylene oxide) with a relatively small molecular weight to result in improved molding properties.

Since a compatibilizer is added to the poly(phenylene oxide) resin composition, even if the mixing ratio of the poly(phenylene oxide) and triallyl isocyanurate is changed, the IPN structure is made easy to be formed to result in improvement of the heat resistance.

Since a flame retardant is added to the poly(phenylene oxide) resin composition, the flame retardancy can be improved.

In the varnish of the poly(phenylene oxide) resin composition containing a solvent, since a nonreactive organic brominated compound on the poly(phenylene oxide) or triallyl isocyanurate is used as the flame retardant, deterioration of the fluidity of the resin attributed to cross-linking reaction of the organic brominated compound with the poly(phenylene oxide) or triallyl isocyanurate can be avoided.

Since the above-described organic brominated compound is not dissolved but dispersed in a solvent, the organic brominated compound can exist as a filler in the composition and therefore, the organic brominated compound does not inhibit the formation of the IPN structure in the cured product of the poly(phenylene oxide) and triallyl isocyanurate to result in high heat resistance.

Since an organic brominated compound having a true specific gravity of 2.0 to 3.5 is to be employed for the flame retardant, the organic brominated compound is hard to be precipitated in the varnish and thus even varnish can be obtained without requiring constant stirring.

30 to 60 parts by weight of the poly(phenylene oxide) is added to 100 parts by weight of the resin composition, so that the heat resistance can be improved.

35 to 62 parts by weight of triallyl isocyanurate is added to 100 parts by weight of the resin composition, so that the heat resistance can be improved.

The organic brominated compound is added as to keep the bromine content in a range from 8 to 20% by weight in the entire poly(phenylene oxide) resin composition, so that the heat resistance can be improved and at the same time the flame retarding property can be high.

Addition of an inorganic filler with an average particle diameter of 30 μm or smaller to the PPO resin composition of the invention decreases the water absorption rate, increases the strength at the time of high temperature heating in the case of soldering treatment or the like, and suppresses the ratio of the dimensional alteration following the heating.

In the case of using silica as the above-described inorganic filler, in addition to the above described effects, the addition contributes to the flame retarding property of the PPO resin composition of the invention.

By setting the addition amount of the inorganic filler to be not less than 3 parts by weight and less than 50 parts by weight to 100 parts by weight of resin solid matter, the water absorption rate can be decreased, the strength can be increased at the time of high temperature heating in the case of soldering treatment or the like, and the ratio of the dimensional alteration following the heating can be suppressed.

Prepreg with excellent molding properties can be obtained by impregnating a substrate with the poly(phenylene oxide) resin composition of the invention and by semi-curing the resin composition by heating and drying.

Laminated sheet with excellent molding properties can be produced by layering a prescribed number of sheets of the above-described prepreg and molding the layered body by heating and pressurizing.

A printed wiring board with excellent molding properties can be produced by forming conductive patters on the surface of the above-described laminated sheet and using the resulting the laminated sheet for production of the printed wiring board.

A printed wiring board for an inner layer, which is produced by layering and molding a prescribed number of sheets of the above-described prepreg by heating and pressurizing the resulting laminated sheet and forming conductive patterns in the surface, and the foregoing prepreg are laminated on each other in layers to obtain a multilayer printed wiring board which is possible to be molded with excellent molding properties and in which the spaces between neighboring conductive patterns are sufficiently filled with resin without leaving voids or blurs.

The invention claimed is:

1. A curable poly(phenylene oxide) resin composition containing a poly(phenylene oxide), a triallyl isocyanurate, and a flame retardant,
    wherein the poly(phenylene oxide) has a number average molecular weight in a range of from 4,000 to 9,100,
    wherein the poly(phenylene oxide) is obtained by reacting at least one unreacted poly(phenylene oxide) with a polyfunctional phenolic compound having two or more phenolic hydroxyl groups,
    wherein the triallyl isocyanurate is present in an amount of from 35 to 62 parts by weight based on 100 parts by weight of the resin composition wherein the entire weight of the resin composition contains no solvent, and
    wherein the flame retardant is decabromodiphenylethane that is dispersed, not dissolved, in a solvent.

2. The curable poly(phenylene oxide) resin composition as described in claim 1, wherein an oxidizing agent is used as an initiator at the time of reaction of poly(phenylene oxide) with the phenolic compound.

3. The curable poly(phenylene oxide) resin composition as described in claim 2, wherein said oxidizing agent is one or more compounds selected from the group consisting of benzoyl peroxide, 3,3',5,5'-tetramethyl-1,4-diphenoquinone, chloranil, 2,4,6-tri-tert-butylphenoxyl radical, tert-butylperoxyisopropyl monocarbonate, and azobisisobutyronitrile.

4. The curable poly(phenylene oxide) resin composition as described in claim 1, further comprising a compatibilizer.

5. The curable poly(phenylene oxide) resin composition according to claim 4, wherein the compatibilizer is at least one selected from the group consisting of styrene-butadiene block copolymer, a styrene-isoprene block copolymer, a 1,2-polybutadiene, a 1,4-polybutadiene, a maleic acid-modified polybutadiene, and an acrylic acid-modified polybutadiene.

6. The curable poly(phenylene oxide) resin composition of claim 1, wherein the poly(phenylene oxide) has a number average molecular weight of from 7,800 to 9,100.

7. The curable poly(phenylene oxide) resin composition of claim 1, having a fluidity measured in accordance with JIS C 6521 of 15.8% to 33.2%.

8. The curable poly(phenylene oxide) resin composition of claim 1, having a fluidity measured in accordance with JIS C 6521 of 19.2% to 33.2%.

9. The curable poly(phenylene oxide) resin composition as described in claim 1, wherein the reacting of the poly (phenylene oxide) with the phenolic compound decreases the molecular weight of the poly(phenylene oxide).

10. The curable poly(phenylene oxide) resin composition described in claim 1, wherein the flame retardant is a filler that does not inhibit the formation interpenetrating network between the poly(phenylene oxide) and the triallyl isocyanurate.

11. The curable poly(phenylene oxide) resin composition described in claim 1, wherein the decabromodiphenylethane is present in an amount so that the bromine content is from 8 to 20% by weight based on the total weight of the poly(phenylene oxide) resin composition.

12. The curable poly(phenylene oxide) resin composition as described in claim 1, wherein the polyfunctional phenolic compound is at least one selected from the group consisting of hydroquinone, pyrogallol and 4,4'-dihydroxydiphenyl ether.

13. The curable poly(phenylene oxide) resin composition as claimed in claim 1, wherein the polyfunctional phenolic compound is hydroquinone.

14. The curable poly(phenylene oxide) resin composition as described in claim 1, wherein the polyfunctional phenolic compound is pyrogallol.

15. The curable poly(phenylene oxide) resin composition as described in claim 1, wherein the polyfunctional phenolic compound is 4,4'-dihydroxydiphenyl ether.

16. The curable poly(phenylene oxide) resin composition of claim 1, wherein the poly(phenylene oxide) is present in an amount of not less than 30 parts by weight in 100 parts by weight of the resin composition.

17. The curable poly(phenylene oxide) resin composition of claim 1, wherein the poly(phenylene oxide) is present in an amount of 30-60 parts by weight in 100 parts by weight of the resin composition.

18. The curable poly(phenylene oxide) resin composition of claim 1, which comprises a poly(phenylene oxide) resin varnish having a concentration of the resin solid matter in the range of 50-90% by weight.

19. A cured poly(phenylene oxide) resin composition obtained by heating and pressing the curable poly(phenylene oxide) resin composition of claim 1.

20. A printed wiring board comprising the cured poly (phenylene oxide) resin composition of claim 19.

21. A prepreg obtained by molding the curable poly (phenylene oxide) resin composition of claim 1.

22. A laminated sheet obtained by heating and pressing a plurality of the prepregs of claim 21.

23. A multilayer printed wiring board obtained by heating and pressing a plurality of the prepregs of claim 21.

* * * * *